United States Patent
Nikutta

(10) Patent No.: US 6,937,953 B2
(45) Date of Patent: Aug. 30, 2005

(54) CIRCUIT CONFIGURATION FOR RECEIVING AT LEAST TWO DIGITAL SIGNALS

(75) Inventor: Wolfgang Nikutta, München (DE)

(73) Assignee: Infineon Technologies AG, Munich (DE)

( * ) Notice: Subject to any disclaimer, the term of this patent is extended or adjusted under 35 U.S.C. 154(b) by 735 days.

(21) Appl. No.: 09/826,234

(22) Filed: Apr. 4, 2001

(65) Prior Publication Data

US 2001/0050952 A1 Dec. 13, 2001

(30) Foreign Application Priority Data

Apr. 4, 2000 (DE) .......................................... 100 16 724

(51) Int. Cl.$^7$ ........................ G01D 18/00; G01P 21/00; G01R 35/00
(52) U.S. Cl. ...................................................... 702/89
(58) Field of Search ........................... 702/79, 89, 107, 702/125, 176; 713/400, 401, 500, 502, 600

(56) References Cited

U.S. PATENT DOCUMENTS

| | | | |
|---|---|---|---|
| 4,736,189 A | * 4/1988 | Katsumata et al. | 341/120 |
| 5,214,680 A | 5/1993 | Gutierrez, Jr. et al. | 377/20 |
| 5,233,637 A | 8/1993 | Koerner et al. | 377/42 |
| 5,237,224 A | 8/1993 | DeLisle et al. | 327/226 |
| 5,243,227 A | 9/1993 | Gutierrez, Jr. et al. | 327/277 |
| 5,283,631 A | 2/1994 | Koerner et al. | 326/121 |
| 6,587,804 B1 | * 7/2003 | Johnson et al. | 702/107 |
| 6,735,709 B1 | * 5/2004 | Lee et al. | 713/401 |

FOREIGN PATENT DOCUMENTS

DE 42 44 696 C2 5/1993
DE 195 10 038 C1 8/1996

OTHER PUBLICATIONS

Published International Application No. WO 98/58449 (Arkin), dated Dec. 23, 1998.

* cited by examiner

*Primary Examiner*—Michael Nghiem
(74) *Attorney, Agent, or Firm*—Laurence A. Greenberg; Werner H. Stemer; Ralph E. Locher

(57) ABSTRACT

A circuit configuration has a calibration circuit, which is connected to terminals for two digital signals and has outputs for two digital output signals which are each derived from one of the digital signals. The calibration circuit effects temporal control of a switching edge of one of the output signals using a control value. A comparison circuit generates a comparison signal which indicates that one of the output signals has a switching edge first relative to the other output signal. The calibration circuit has a control input, through which the control value, which is stored in a storage circuit, can be set using the state of the comparison signal of the comparison circuit. The circuit configuration makes it possible to compensate undesirable propagation time differences between the digital signals.

12 Claims, 4 Drawing Sheets

CIRCUIT CONFIGURATION FOR RECEIVING AT LEAST TWO DIGITAL SIGNALS

BACKGROUND OF THE INVENTION

FIELD OF THE INVENTION

The present invention relates to a circuit configuration for receiving at least two digital signals.

On account of a specification which is often very tight with respect to time, integrated circuits (ICs) in which a plurality of digital signals are received and processed at comparatively high switching speeds require signal propagation times which are matched very precisely with respect to time, for example between the different components on the printed circuit board ("PCB") on which the respective integrated circuit is applied.

To that end, it is generally necessary that, in particular, interconnect lengths and impedances of bus systems or electrical connections within the IC housings and also interconnect lengths within integrated circuits are matched to one another as exactly as possible. In this case, it is expedient to incorporate existing input buffer circuits, which likewise cause signal delays as a rule. A systematic mismatch or existing manufacturing tolerances in the dimensioning of line parameters can in this case lead to reduced temporal safety margins between electrical signals and hence to a smaller bandwidth of the entire system. In addition, the requirement of adhering to small tolerances in manufacture can cause considerable costs, for example as a result of measurements, monitoring and rejection.

In digital synchronous circuits, the "timing specifications" are usually referred to a clock signal, in some cases also to a plurality of clock signals such as e.g. "transmit and receive clocks" or else differential clock signals. Existing individual propagation time variations on signal lines, such as e.g. address lines or data and control lines, relative to this reference clock restrict the reliable operating range and hence the maximum speed that can be achieved by the system.

SUMMARY OF THE INVENTION

It is accordingly an object of the invention to provide a circuit configuration for receiving at least two digital signals which overcomes the above-mentioned disadvantages of the prior art devices of this general type, with which two digital signals can be processed further without temporal limitations, so that costly matching of line parameters and manufacturing tolerances is not necessary.

With the foregoing and other objects in view there is provided, in accordance with the invention, a circuit configuration containing terminals for receiving at least two digital signals and a calibration circuit connected to the terminals and have outputs outputting at least two digital output signals each derived from one of the digital signals. The calibration circuit effects a temporal control of a switching edge of one of the two digital output signals using a control value and the calibration circuit contains a storage circuit for storing the control value. A comparison circuit is connected to the outputs and has a terminal for a comparison signal indicating that one of the two digital output signals has a switching edge first relative to another of the two digital output signal. The calibration circuit has a control input through which the control value can be set using a state of the comparison signal of the comparison circuit.

The object is achieved by a circuit configuration for receiving at least two digital signals. The circuit configuration has the calibration circuit, which is connected to terminals for at least two digital signals and has outputs for at least two digital output signals which are each derived from one of the digital signals. The calibration circuit effects temporal control of a switching edge of one of the output signals using a control value. The circuit configuration has a comparison circuit, which is connected to the outputs and has a terminal for a comparison signal which indicates that one of the output signals has a switching edge first relative to the other output signal. The calibration circuit contains a storage circuit for storing the control value, and has a control input, via which the control value can be set using the state of the comparison signal of the comparison circuit.

The circuit configuration according to the invention makes it possible to set one of the digital signals or the switching edges thereof in relation to the other digital signal such that output signals with temporally coordinated switching edges can be picked off for further processing at the output of the circuit configuration. As a result, it is possible to compensate undesirable propagation time differences between the two digital signals. In this case, the comparison signal of the comparison circuit indicates with an active state that the switching edges of the output signals are not temporally coordinated. By the corresponding control of the calibration circuit, one of the output signals or the switching edges thereof can be set via the control value until the comparison signal of the comparison circuit is no longer in the active state. If this state has been reached, the two output signals which are each derived from the digital signals are synchronized with one another. In this case, only the instant of the switching edges of the digital signals is changed, so that the latter are coordinated with one another. The digital signals otherwise remain unchanged. The two digital signals can thus be processed further without temporal limitations.

The described calibration of the circuit configuration is carried out for example in a function mode or a test mode. In this case, the signals to be calibrated are generated synchronously with one another by a driving circuit, for example an external test device, and applied to a receiving circuit for example via buffer circuits and bus lines, which receiving circuit contains the circuit configuration according to the invention. The control value set in the test mode is stored in the storage circuit, so that temporal control of the signals can be carried out using the control value in a normal mode.

In a development of the invention, the terminal for the comparison signal of the comparison circuit is connected to the control input of the calibration circuit. As a result, it is possible for the circuit configuration, or an integrated circuit containing the circuit configuration, to calibrate itself automatically. Therefore, the control value of the calibration circuit is set directly by the state of the comparison signal of the comparison circuit.

The setting operation is preferably performed by a comparison signal of the comparison circuit which has a periodic profile in an active state. The control value can thereby be set digitally, for example by activation of a counter which is incremented e.g. by one step in each case in a period of the comparison signal.

In accordance with an added feature of the invention, the comparison signal indicates with an active state that one of the two digital output signals has a switching edge first relative to the other of the two digital output signals, and the comparison circuit is embodied in such a way that the comparison signal has a periodic profile in the active state.

In accordance with a further feature of the invention, the two digital output signals have a periodic profile, and the comparison signal of the comparison circuit in the active state has a frequency of that output signal whose switching edges temporally precede corresponding switching edges of the other one of the two digital output signals.

A time comparison of switching edges of two signals can be realized comparatively simply by a bistable multivibrator in the form of a flip-flop. In the case of a realization of the circuit configuration using CMOS technology which has a structure width or channel lengths of the transistors of less than 0.2 μm, a time difference of a few picoseconds can usually still be reliably detected in the case of a symmetrical layout of the comparison circuit.

In order that a changeover instant of the comparison signal of the comparison circuit from the active state into an inactive state is detected more precisely, it is advantageous for a filter circuit and/or an integrator circuit to be connected downstream of the terminal for the comparison signal of the comparison circuit. In this case, the comparison signal changes over from the active state into the inactive state, or vice versa, if both output signals have switching edges that occur approximately simultaneously. On account of statistical effects (e.g. on account of signal indeterminacies), temporal regions in which active and inactive comparison signals occur with approximately the same frequency usually occur around the changeover point. Consequently, a control value (calibration value) to be determined can be determined very exactly by a filter circuit connected downstream and/or by an integrator circuit.

In a development of the invention, the calibration circuit has a delay circuit which, for its part, has an input which is connected to one of the terminals for the digital signals, for setting a delay of a switching edge of one of the digital signals. In this case, an output of the delay circuit is connected to one of the outputs. Thus, existing propagation time differences between the two digital signals are compensated by a switching edge of one of the signals being temporally delayed.

The delay circuit preferably contains delay elements that can be set digitally. A delay to be set can thereby be set using a digital control value, which is stored for example in a register with a plurality of register bits. A delay can therefore be set in steps, for example with a periodic signal, as described above. In this case, the individual steps of the delay need not be strictly linear, since the circuit configuration or the calibration circuit can iteratively approximate to a correct control value. In this case, it must be ensured that the delay can change continuously. Delay elements that can be set digitally can be realized for example in the form of inverter chains that can be connected up.

In a further embodiment of the invention, the delay circuit has delay elements that can be set in an analog manner. The delay elements may be realized for example in the form of adjustable RC delay elements. It is possible, in principle, to combine delay elements that can be set digitally with delay elements that can be set in an analog manner.

In order to be able to calibrate both rising and falling switching edges, in a development of the invention the calibration circuit and the terminals for the digital signals can be respectively coupled to one another via an inverter circuit. In this case, both types of switching edges can be calibrated independently of one another by a changeover switch.

The circuit configuration according to the invention can be integrated comparatively simply in test and measuring devices. As a result, it is possible to synchronize test signals of, for example, high-speed test devices which have generally been calibrated heretofore with the aid of "sample scopes" in a manner involving a comparatively high outlay in respect of costs and time requirement.

Other features which are considered as characteristic for the invention are set forth in the appended claims.

Although the invention is illustrated and described herein as embodied in a circuit configuration for receiving at least two digital signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
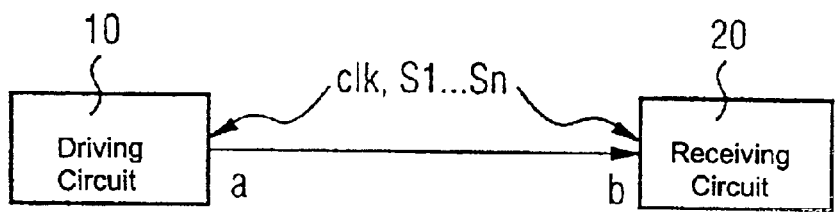
FIG. 1 is a diagrammatic illustration of two circuits and related signals with propagation time differences.
Figure 1:
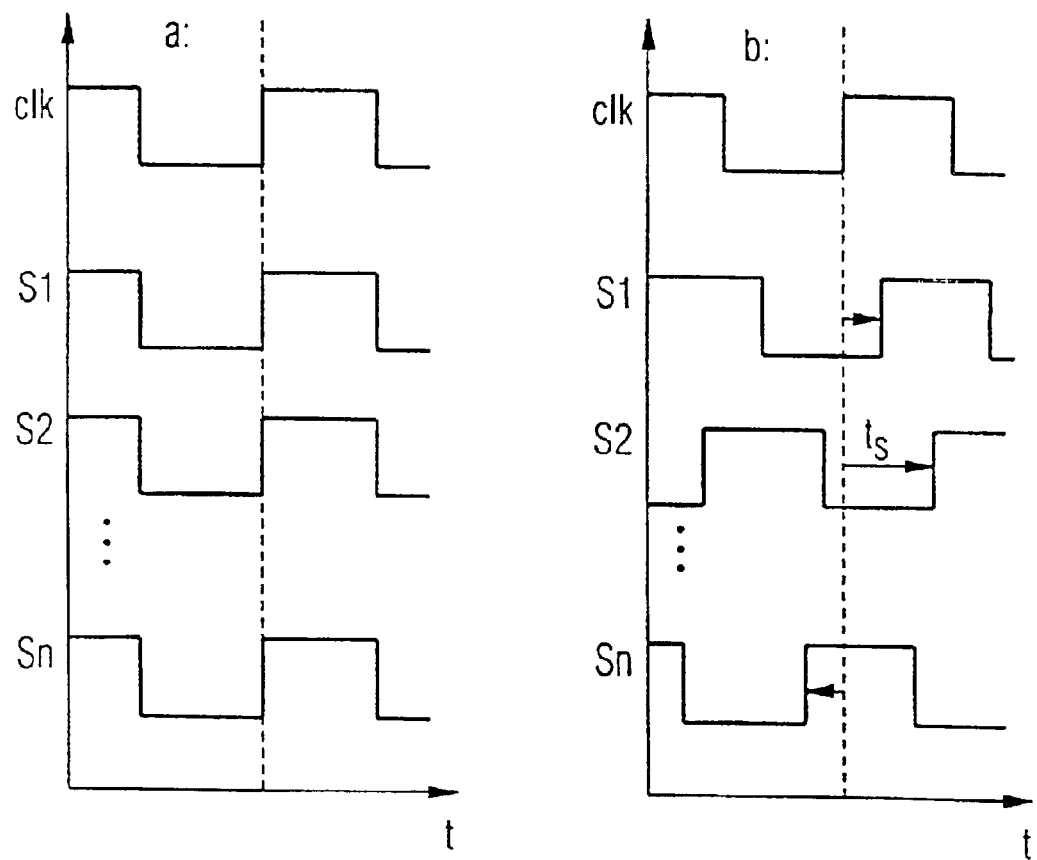

In all the figures of the drawing, sub-features and integral parts that correspond to one another bear the same reference symbol in each case. Referring now to the figures of the drawing in detail and first, particularly, to FIG. 1 thereof, there is shown in an upper part an integrated circuit being a driving circuit 10 and an integrated circuit being a receiving circuit 20, which are connected to one another via a signal bus. A clock signal clk and signals S1 to Sn are transmitted via the signal bus. The integrated circuit 10 is in a test mode, for example. In this mode, all signals are transmitted synchronously with the clock signal clk. The corresponding signal profiles are illustrated by way of example in the lower part of FIG. 1.

In the example illustrated in FIG. 1, it shall be assumed that the signals S1 to Sn have different signal propagation times. In other words, the signals S1 to Sn have temporal shifts at an input of the integrated circuit 20, the shifts being identified as time $t_s$. The temporal shifts are also referred to as "skews".

The driving circuit 10 has a function mode or test mode in which the signals S1 to Sn are generated synchronously with the clock signal clk. If later calibration of the signals S1 to Sn is intended to be carried out, then the condition t(period)>2 tS must be fulfilled in the case of periodic signals S1 to Sn. Only in this way is it possible to ascertain unambiguously whether a signal S1 to Sn is transmitted to the receiving circuit 20 too quickly or too slowly in relation to the reference signal clk. In this case, it is unimportant if the generated signals S1 to Sn are already generated in a manner shifted with respect to one another at the driving circuit 10, as long as this offset is also maintained in a normal mode.

Figure 2:
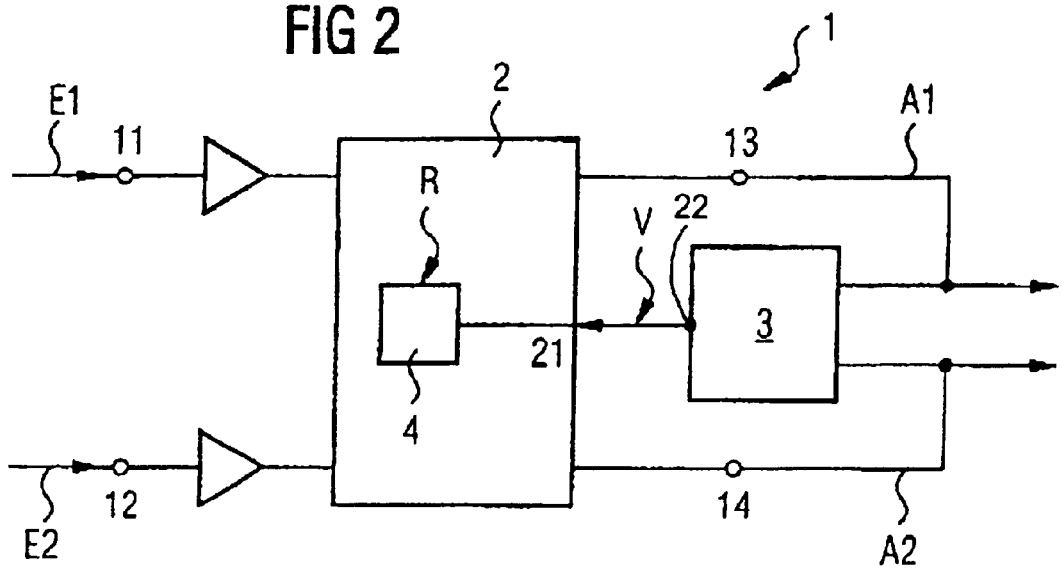
FIGS. 2 and 3 are block circuit diagrams of two embodiments according to the invention.

FIG. 2 illustrates an embodiment of a circuit configuration 1 according to the invention, which is contained in the receiving circuit 20, for example. The circuit configuration 1 has terminals 11 and 12 for receiving at least two digital input signals E1 and E2, respectively. The signal E1 is, for example, the clock signal clk from FIG. 1. The signal E2 is, for example, one of the signals S1 to Sn from FIG. 1. Two digital output signals A1 and A2 which are each derived from one of the input signals E1 and E2, respectively, can be picked off at outputs 13 and 14 of a calibration circuit 2. The output signals A1 and A2 are applied for example to a further circuit such as e.g. an address latch. The calibration circuit 2 is connected between the terminals 11, 12 and the outputs 13, 14. In this case, the calibration circuit 2 is connected via a respective input buffer circuit to the terminals 11 and 12. A comparison circuit 3 is connected to the outputs 13 and 14 and has a terminal 22 for a comparison signal V. The comparison signal V indicates with an active state that, for example, the output signal A1 has a switching edge first relative to the output signal A2.

In the embodiment according to FIG. 2, the terminal 22 for the comparison signal V of the comparison circuit 3 is connected to a control input 21 of the calibration circuit 2. Via the control input 21, a control value R can be set using the state of the comparison signal V. The control value R is stored in the storage circuit 4 contained in the calibration circuit 2. Temporal control for example of the output signal A2 or control of the switching edge thereof can be performed using the control value R.

Figure 4:
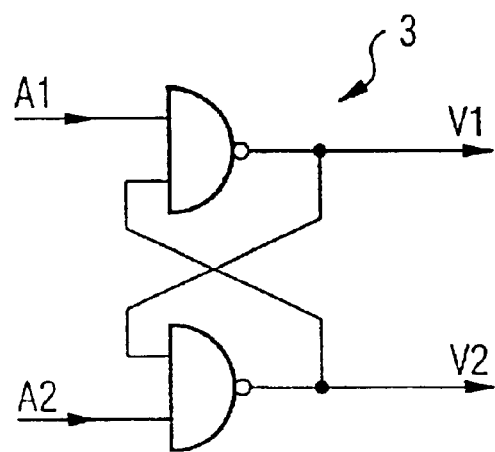
FIGS. 4 and 5 are circuit diagrams of embodiments of a comparison circuit.

In this case, a time comparison of two rising switching edges in the comparison circuit 3 can be realized relatively simply by a bistable multivibrator in the form of a flip-flop in accordance with FIG. 4. The flip-flop illustrated has NAND gates for this purpose. If the signal A2 has for example a rising switching edge before the signal A1, then the comparison signal V2 has an active state and the comparison signal V1 has an inactive state. The states of the comparison signals V1 and V2 are correspondingly inverted if the signal A1 has a rising switching edge before the signal A2.

Figure 5:
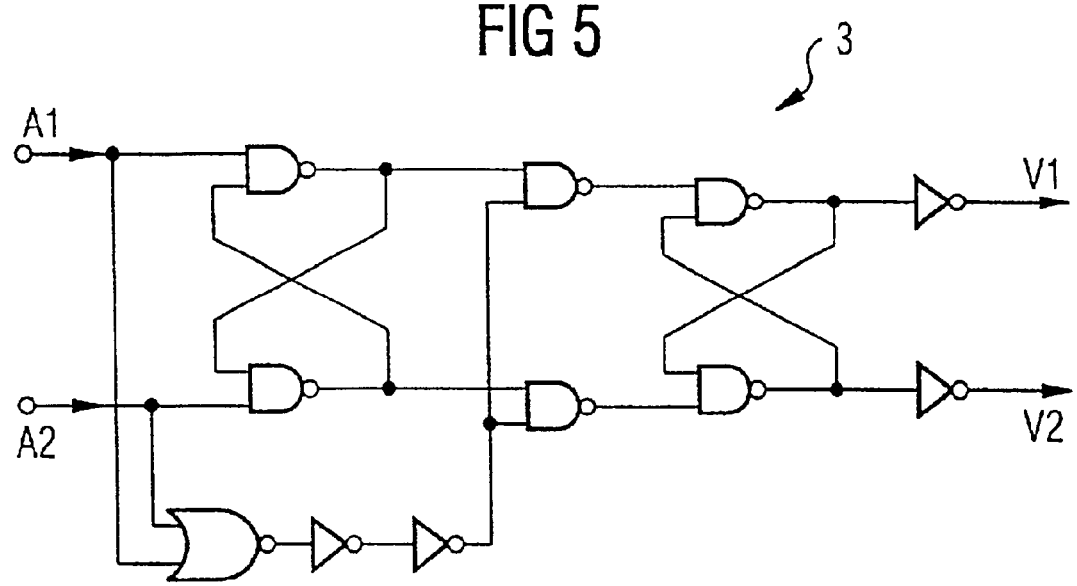

FIG. 5 illustrates a further embodiment of the comparison circuit 3. The latter is realized for example using standard TTL gates and is extended by additional gates in comparison with FIG. 4, which gates have the following effect: if the signal A2 has a rising switching edge which occurs before a rising switching edge of the signal A1, then the comparison signal V2 generates a signal pulse which is switched off again with the falling edge of the signal A2. Thus, in the case of periodic signals A1 and A2, for the faster signal a comparison signal V1 or V2 with the same frequency is generated. These signal pulses can be used to set the temporal control of the calibration circuit 2 in a stepwise manner. By way of example, "variable delays" are incremented or decremented, controlled by a respective signal pulse of the signals V1 and V2.

Figure 6:
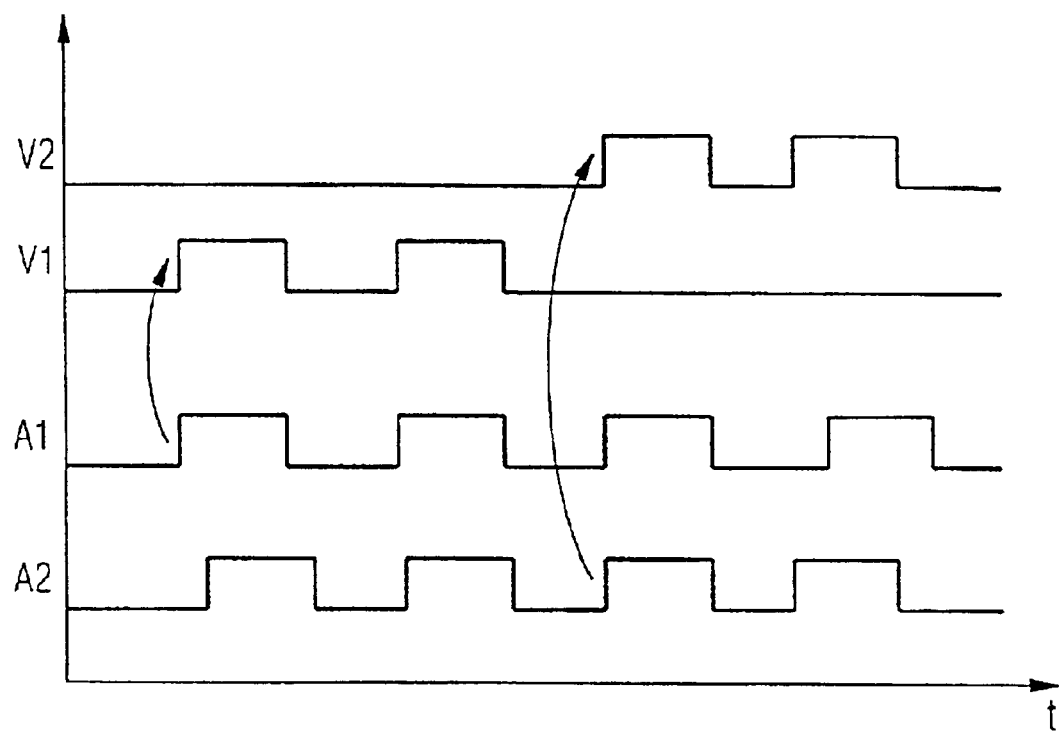
FIG. 6 is a timing diagram of signals in accordance with the embodiment according to FIG. 5.

FIG. 6 shows a diagrammatic illustration of signals in accordance with the embodiment according to FIG. 5. In this example, the signal A1 has rising switching edges which initially occur before the rising switching edges of the signal A2. As a result, a comparison signal V1 is generated, which, in the active state, has the frequency of the output signal A1, whose switching edges temporally precede the corresponding switching edges of the output signal A2. As soon as the switching edges of the signal A2 precede the corresponding switching edges of the signal A1, a corresponding active comparison signal V2 is generated, which has the frequency of the signal A2. In this example, a variable delay for the signal A1 has thus been incremented until the switching edges of the signal A2 precede the corresponding switching edges of the signal A1. The changeover instant between the active signal V1 and the active signal V2 can be utilized for recognizing the correct calibration value.

On account of statistical effects (e.g. on account of signal indeterminacies), temporal regions ("jitter") in which periodic comparison signals V1 and V2 occur with the same frequency usually occur around the changeover point. The pulse ratio of the two comparison signals V1 and V2 can be measured in this region of indeterminacy by a suitable circuit 7, such as e.g. a filter circuit and/or an integrator circuit. As a result, the calibration value or the control value R can be determined very exactly.

Figure 3:
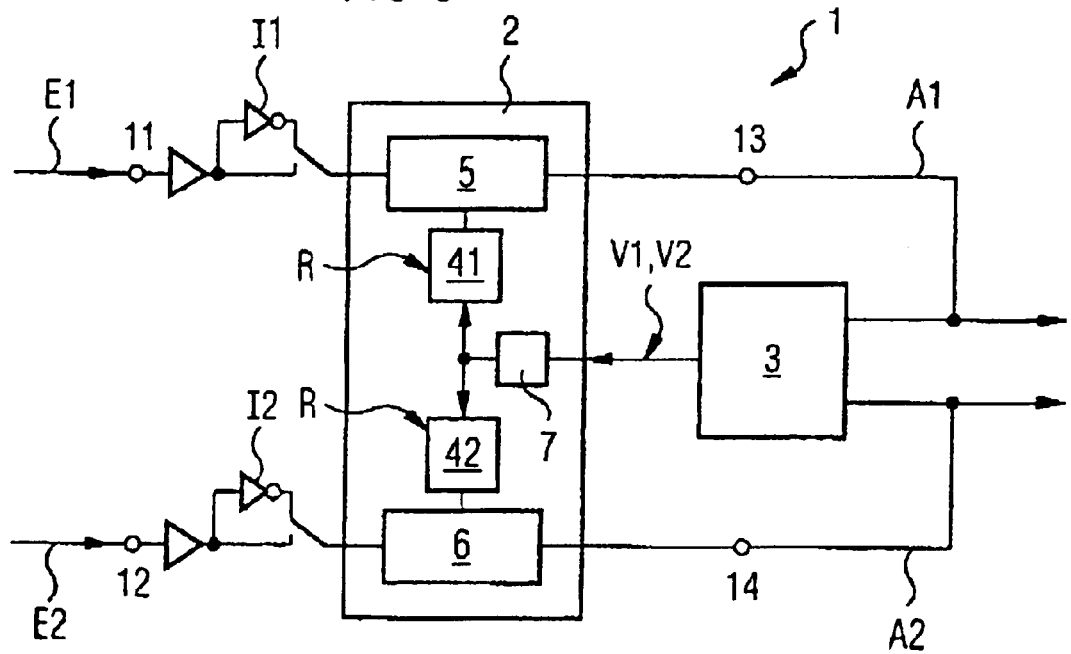

FIG. 3 illustrates a further embodiment of the circuit configuration according to the invention. This circuit configuration has, at the terminal for the comparison signal V of the comparison circuit 3, which is extended here to the comparison signals V1 and V2, the abovementioned circuit in the form of the filter circuit and/or an integrator circuit 7. In this example, the calibration circuit 2 has two delay circuits 5 and 6, whose inputs are respectively connected to one of the terminals 11 and 12 of the circuit configuration 1. The outputs of the delay circuits 5 and 6 are connected to one of the outputs 13 and 14, respectively. A delay of a switching edge of the respective input signals E1 and E2 can be respectively set via the delay circuits 5 and 6. The respective calibration value or control value R is stored in each case separately for the delay circuit 5 and 6 in storage circuits 41 and 42, respectively.

The delay circuits 5 and 6 in this case have delay elements that can be set digitally. In other words, a respective delay can be set in a variable manner in the respective delay circuit 5 or 6. As an alternative to this, the variable delay of one of the input signals E1 or E2 can also be replaced by a fixed delay. If, for example, the delay range of one of the delay circuits is 0 to 1000 picoseconds, the delay of a reference signal can be fixedly set at 500 picoseconds, for example. The respective other delay circuit can then be set in a variable manner relative thereto in a range of ±500 picoseconds.

The individual steps of a variable delay circuit need not be strictly linear, since the calibration circuit, for example in a test mode, iteratively approximates to the correct control value. However, it must be ensured that the respective delay can change continuously.

The respective control values are stored for example in registers with a plurality of register bits. In the case of a regulation range of 1000 picoseconds and a resolution of 1 picosecond, approximately 10 register bits are necessary for this purpose.

In order to be able to equally calibrate rising switching edges and falling switching edges, the calibration circuit 2 and the terminals 11 and 12 can be respectively coupled to one another via an inverter circuit I1 and I2. Both switching edges can be calibrated independently of one another by a changeover switch. The requisite control values may differ here. In this case, the calibration circuit 2 has, in total, enough storage circuits that the control values for the rising switching edges and falling switching edges can be stored in each case.

I claim:

1. A circuit configuration, comprising:
   terminals for receiving at least two digital signals;
   a calibration circuit connected to said terminals and having outputs outputting at least two digital output signals each derived from one of the digital signals, said calibration circuit effecting a temporal control of a switching edge of one of the two digital output signals using a control value, said calibration circuit containing a storage circuit for storing the control value; and a comparison circuit connected to said outputs and having a terminal for a comparison signal indicating that one of the two digital output signals has a switching edge first relative to another of the two digital output signals;

said calibration circuit has a control input for setting the control value using a state of the comparison signal of said comparison circuit.

2. The circuit configuration according to claim 1, wherein said terminal for the comparison signal of said comparison circuit is connected to said control input of said calibration circuit.

3. The circuit configuration according to claim 1, wherein the comparison signal indicates with an active state that one of the two digital output signals has a switching edge first relative to the other of the two digital output signals, and said comparison circuit is embodied in such a way that the comparison signal has a periodic profile in the active state.

4. The circuit configuration according to claim 3, wherein the two digital output signals have a periodic profile, and the comparison signal of said comparison circuit in the active state has a frequency of that output signal whose switching edges temporally precede corresponding switching edges of the other one of the two digital output signals.

5. The circuit configuration according to claim 1, wherein said comparison circuit has a bistable multivibrator.

6. The circuit configuration according to claim 1, wherein said calibration circuit has a circuit performing at least one of a filtering function and an integrating function and is connected to said terminal for the comparison signal of said comparison circuit.

7. The circuit configuration according to claim 1, wherein said calibration circuit contains a delay circuit having an input connected to one of said terminals for the digital signals, said delay circuit setting a delay of a switching edge of one of the digital signals, and said delay circuit has an output connected to one of said outputs of said calibration circuit.

8. The circuit configuration according to claim 7, wherein said delay circuit contains delay elements that can be set digitally.

9. The circuit configuration according to claim 7, wherein said delay circuit contains delay elements that can be set in an analog manner.

10. The circuit configuration according to claim 1, including an inverter circuit disposed and connected between said calibration circuit and said terminals.

11. A measuring device, comprising:

a circuit configuration, including:
   terminals for receiving at least two digital signals;
   a calibration circuit connected to said terminals and having outputs for at least two digital output signals each derived from one of the digital signals, said calibration circuit effecting temporal control of a switching edge of one of the two digital output signals using a control value, said calibration circuit containing a storage circuit for storing the control value; and
   a comparison circuit connected to said outputs and having a terminal for a comparison signal which indicates that one of the two digital output signals has a switching edge first relative to another of the two digital output signals;
   said calibration circuit having a control input for setting the control value using a state of the comparison signal of said comparison circuit.

12. A test device, comprising:

a circuit configuration, including:
   terminals for receiving at least two digital signals;
   a calibration circuit connected to said terminals and having outputs for at least two digital output signals each derived from one of the digital signals, said calibration circuit effecting temporal control of a switching edge of one of the two digital output signals using a control value, said calibration circuit containing a storage circuit for storing the control value; and
   a comparison circuit connected to said outputs and having a terminal for a comparison signal which indicates that one of the two digital output signals has a switching edge first relative to another of the two digital output signals;
   said calibration circuit having a control input for setting the control value using a state of the comparison signal of said comparison circuit.

* * * * *